US006946778B2

(12) United States Patent
Miura

(10) Patent No.: US 6,946,778 B2
(45) Date of Patent: Sep. 20, 2005

(54) SURFACE-MOUNT CASING AND CRYSTAL UNIT USING SAME

(75) Inventor: Masaaki Miura, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 242 days.

(21) Appl. No.: 10/638,279

(22) Filed: Aug. 8, 2003

(65) Prior Publication Data

US 2004/0085003 A1 May 6, 2004

(30) Foreign Application Priority Data

Aug. 9, 2002 (JP) ....................................... 2002-233350

(51) Int. Cl.[7] ...................... H01L 41/053; H01L 41/047
(52) U.S. Cl. ........................................ 310/348; 310/365
(58) Field of Search .................................. 310/348, 365

(56) References Cited

U.S. PATENT DOCUMENTS 5,525,855 A * 6/1996 Gotoh et al. ................ 310/344
6,117,355 A * 9/2000 Yoshizawa et al. .... 252/62.9 R

* cited by examiner

*Primary Examiner*—Thomas M. Dougherty
(74) *Attorney, Agent, or Firm*—Choate, Hill & Stewart, LLP

(57) ABSTRACT

A surface-mount casing for accommodating a quartz crystal blank to constitute a quartz crystal unit has a casing body, a pair of first connecting terminals disposed on respective paired diagonal corners of an inner bottom surface of the casing body, and a pair of second connecting terminals disposed on respective other paired diagonal corners of the inner bottom surface of the casing body. The second connecting terminals extend more closely to a center of the inner bottom surface than the first connecting terminals. The first connecting terminals are thicker than the second connecting terminals. A crystal blank having a pair of excitation electrodes and a pair of extension electrodes extending to outer peripheral portions from the excitation electrodes is held with the extension electrodes being electrically and mechanically connected to either the first connecting electrodes or the second connecting electrodes depending on the size of the crystal blank.

10 Claims, 2 Drawing Sheets

SURFACE-MOUNT CASING AND CRYSTAL UNIT USING SAME

BACKGROUND OF THE INVENTION

1. Field of the Invention

The present invention relates to a surface-mount casing for housing therein a quartz crystal blank to construct a surface-mounted quartz crystal unit, and more particularly to a surface-mount casing which is capable of selectively housing therein crystal blanks having different sizes and a crystal unit using such a surface-mount casing.

2. Description of the Related Art

Surface-mount crystal units which are surface-mounted on wiring boards are small in size and weight, and hence are incorporated especially in oscillators in portable electronic devices. The Surface-mount crystal units generally employ a surface-mount casing comprising a casing body which has a recess defined in one principal surface thereof. A crystal blank is fixedly mounted on the bottom of the recess in the casing body, after which the opening of the recess is closed by a cover, hermetically sealing the crystal blank in the recess. Generally, the crystal blank is fixed to the casing body at two points on its outer circumferential portion. With crystal units for use in mobile devices such as cellular phone units, the crystal blank is generally fixed in position at opposite sides of one end thereof. With crystal units for use in other electronic devices, the crystal blank is generally fixed in position at opposite longitudinal ends thereof. There is also known a crystal unit having a substantially rectangular crystal blank that is fixed to a casing body at two positions on respective opposite ends of one diagonal line of the crystal blank.

FIGS. 1A and 1B shows a conventional surface-mount crystal unit by way of example. The crystal unit has casing body 1 in the shape of a substantially rectangular parallelepiped with a recess defined therein, crystal blank 2 disposed in the recess, and cover 3 mounted on casing body 1 to hermetically seal crystal blank 2 in casing body 1. Connecting terminals 4 for electrically connecting to crystal blank 2 are disposed on the bottom of the recess at respective positions on opposite ends of one diagonal line of the bottom of the recess. Mounting electrodes 5 are disposed on an outer bottom surface of casing body 1 for mounting the surface-mount crystal unit on a wiring board. Connecting terminals 4 and mounting terminals 5 are electrically connected to each other by electrically conductive paths (not shown) such as through holes in casing body 1. Mounting terminals 5 may be disposed respectively in central regions on a pair of opposite sides of the bottom of casing body 1 or may be disposed respectively on four corners of the bottom of casing body 1.

FIG. 2 shows a structure of crystal blank 2 by way of example. Crystal blank 2 comprises a substantially rectangular AT-cut quartz crystal blank, for example. Excitation electrodes 6 are disposed coextensively on the respective opposite principal surfaces of crystal blank 2. Extension electrode 7 extends from one of excitation electrodes 6 to a corner of crystal blank 2 along one diagonal line thereof, and another extension electrode 7 extends from other excitation electrode 6 to an opposite corner of crystal blank 2 along the same diagonal line thereof. Extension electrodes 7 are folded back a short distance over the other principal surfaces across the diagonal corners. The diagonal corners to which extension electrodes 7 extend are bonded to respective connecting terminals 4 of casing body 1 by electrically conductive adhesive 8, thus electrically and mechanically connecting crystal blank 2 to casing body 1.

Since crystal blank 2 is held in position at the opposite ends of one diagonal line, if the longitudinal direction of crystal blank 2 is aligned with Z' axis, in particular, of the crystallographic axes (X-, Y'-, and Z'-axes) of quartz crystal in the AT-cut quartz crystal blank, then the direction in which crystal blank 2 is held approaches the Z-axis ±30° directions where the stress sensitivity of the quartz crystal shows null. Therefore, the crystal unit exhibits good stress sensitivity characteristics such that adverse effects imposed on frequency vs. temperature characteristics by stresses applied to crystal blank 2 due to temperature changes are reduced.

However, since the above surface-mount crystal unit uses crystal blanks having different sizes, its outer profile differs depending on the vibration frequency, for example. The surface-mount casing has its outer profile dimensions determined as de facto standards, i.e., 8 mm×4.5 mm. Therefore, if crystal blanks having different outer profile dimensions, particularly longitudinal dimensions, are housed in surface-mount casings having the same outer profile dimensions, then it is necessary to change the distance between connecting terminals 4 on the bottom of casing body 1.

If crystal blank 2 has a larger outer profile dimension or length, then connecting terminals 4 need to be formed shorter, and if crystal blank 2 has a smaller outer profile dimension or length, then connecting terminals 4 need to be formed longer. For this reason, it is necessary to keep in stock a plurality of casing bodies 1 with connecting terminals 4 having different lengths, with the result that production management schemes become complex and the cost of the surface-mount crystal unit is high. Though the AT-cut quartz crystal blank has its vibration frequency determined depending on its thickness, its optimum outer planar dimensions are determined in view of vibration characteristics and shock-resistance capability. Generally, as the vibration frequency is higher, the outer dimensions of the crystal blank are smaller.

SUMMARY OF THE INVENTION

It is a first object of the present invention to provide a surface-mount casing which is capable of selectively housing a plurality of crystal blanks having different outer profile dimensions.

A second object of the present invention is to provide a surface-mount crystal unit using a surface-mount casing which is capable of selectively housing a plurality of crystal blanks having different outer profile dimensions.

To achieve the first object, there is provided in accordance with the present invention a surface-mount casing has a casing body, a pair of first connecting terminals disposed on respective paired diagonal corners of an inner bottom surface of the casing body, and a pair of second connecting terminals disposed on respective other paired diagonal corners of the inner bottom surface of the casing body. The second connecting terminals extend more closely to a center of the inner bottom surface than the first connecting terminals. The first connecting terminals are thicker than the second connecting terminals.

To achieve the second embodiment, a crystal unit has the above surface-mount casing, and also includes a crystal blank having a pair of excitation electrodes and a pair of extension electrodes extending to outer peripheral portions of the crystal blank from the excitation electrodes. The crystal blank is held in the casing body with the extension electrodes being electrically and mechanically connected to either the first connecting electrodes or the second connecting electrodes depending on the size of the crystal blank.

The surface-mount casing according to the present invention is capable of selectively housing a plurality of crystal blanks having different sizes, in particular different lengths.

DETAILED DESCRIPTION OF THE INVENTION

Figure 1A:
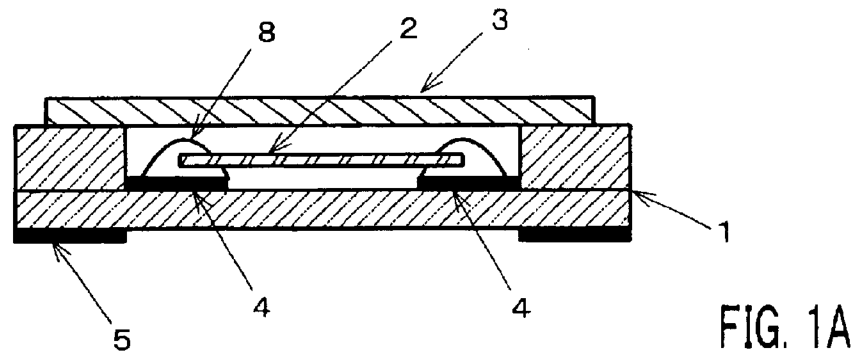
FIG. 1A is a cross-sectional view of a conventional surface-mount crystal unit.
Figure 1B:
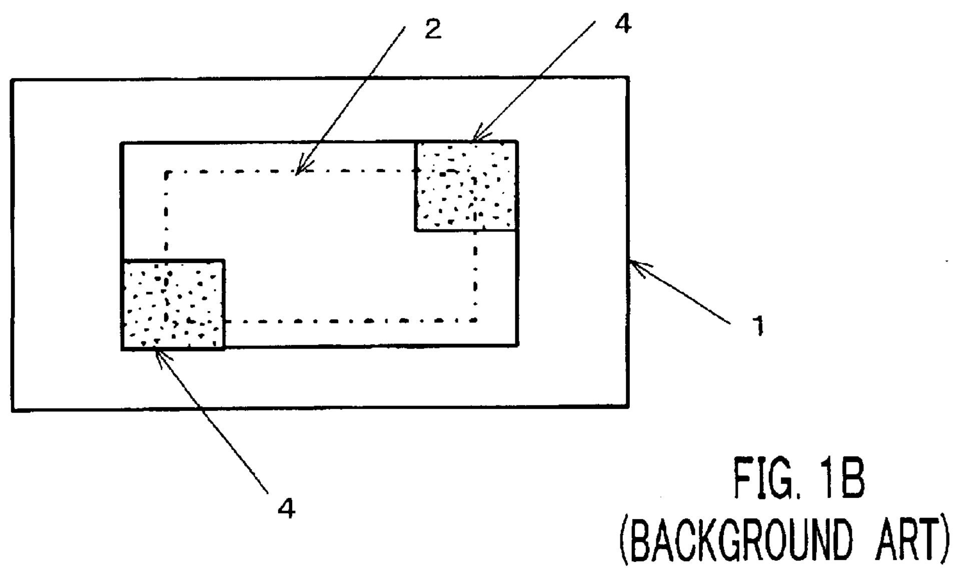
FIG. 1B is a plan view of the conventional surface-mount crystal unit shown in FIG. 1A, with a cover omitted from illustration.
Figure 3A:
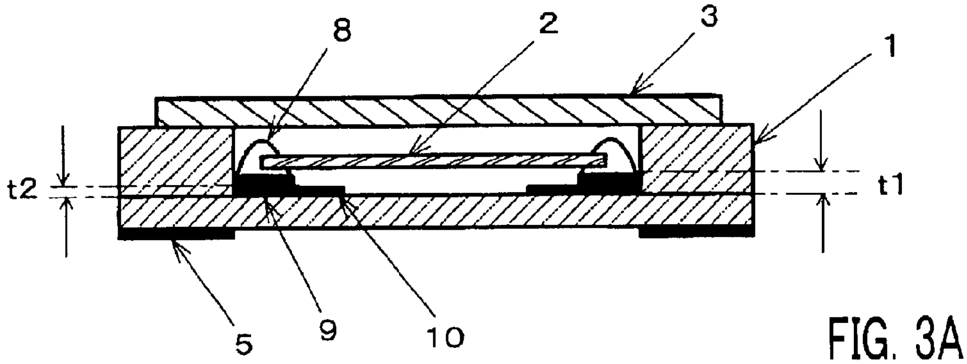
FIG. 3A is a cross-sectional view of a surface-mount crystal unit according to an embodiment of the present invention.
Figure 3B:
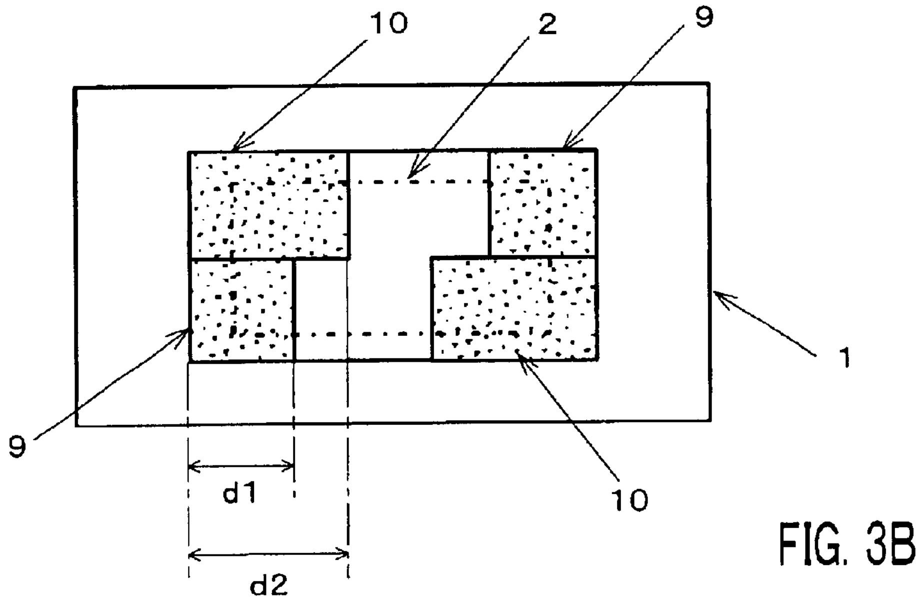
FIG. 3B is a plan view of the surface-mount crystal unit shown in FIG. 3A, with a cover omitted from illustration.

In FIGS. 3A and 3B which show a surface-mount quartz crystal unit according to an embodiment of the present invention, those parts which are identical to those of the conventional surface-mount crystal unit shown in FIGS. 1A and 1B are denoted by identical reference numerals.

Figure 2:
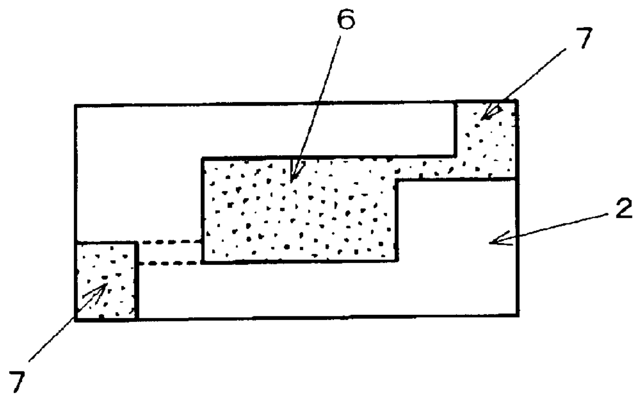
FIG. 2 is a plan view of a crystal blank.

As with the above-described conventional crystal unit, the surface-mount crystal unit according to the present embodiment has casing body 1 made of ceramic in the shape of a substantially rectangular parallelepiped with a recess defined therein, quartz crystal blank 2 disposed in the recess, and cover 3 mounted on casing body 1 to hermetically seal crystal blank 2 in casing body 1. Crystal blank 2 is of a structure identical to the structure of the crystal blank shown in FIG. 2.

The bottom of the recess in casing body 1 has a substantially rectangular elongate shape. A pair of first connecting terminals 9 is disposed on the bottom of the recess at respective positions on opposite ends of one diagonal line of the bottom of the recess, and a pair of second connecting terminals 10 is disposed on the bottom of the recess at respective positions on opposite ends of another diagonal line of the bottom of the recess. First connecting terminals 9 and second connecting terminals 10 that are disposed along shorter sides of the recess are electrically connected to each other. Specifically, one first connecting terminal 9 and one second connecting terminal 10 are disposed along each shorter side of the recess, and are integrally formed with each other. While first connecting terminals 9 and second connecting terminals 10 are substantially rectangular in planar shape, they are different from each other in planar size and thickness. First connecting terminals 9 and second connecting terminals 10 that are connected in common are electrically connected through a non-illustrated electrically conductive paths to mounting electrodes 5 that are disposed on an outer bottom surface of casing body 1.

Each of first connecting terminals 9 extends a distance d1 from a shorter side of the recess and has a thickness t1. Each of second connecting terminals 10 extends a distance d2 from a shorter side of the recess and has a thickness t2. The distance d2 is greater than the distance d1, with the result that second connecting terminals 10 have distal ends positioned more closely to the center of the recess than first connecting terminals 9. The thickness t2 of second connecting terminals 10 is smaller than the thickness t1 of first connecting terminals 9.

Connecting terminals 9, 10 are formed at the same time that casing body 1 is formed by baking a green sheet of ceramics. Specifically, base layer electrodes made of W (tungsten) or Mo (molybdenum), which have planar sizes corresponding to those of first and second connecting terminals 9, 10, are printed on the green sheet, and base layer electrodes corresponding to first connecting terminals 9 are printed again over the previously printed base layer electrodes, thus making first connecting terminals 9 thicker than second connecting terminals 10. Then, a frame wall which will serve as a side wall of the recess is stacked on the green sheet. The assembly is now baked. Thereafter, an Ni (nickel) layer is plated on the base layer electrodes, and then an Au (gold) layer or the like is plated on the Ni layer.

Figure 4:
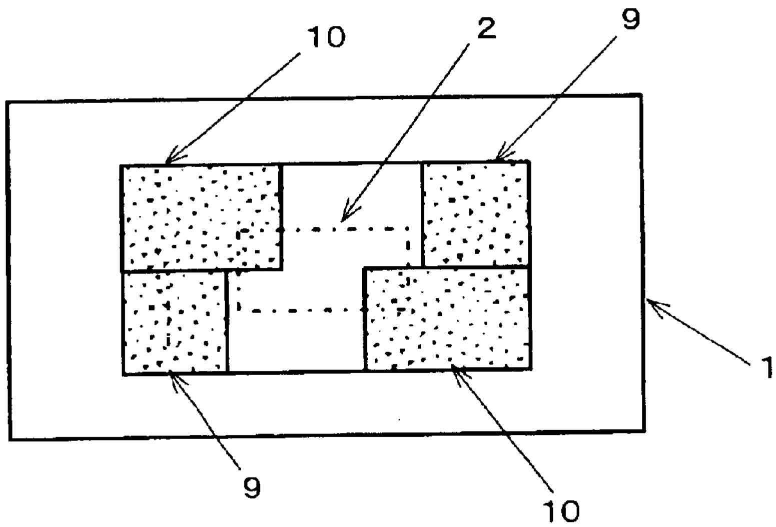
FIG. 4 is a plan view of the surface-mount crystal unit shown in FIG. 3A, with a cover omitted from illustration, in which a relatively small crystal blank is housed in a casing.

With the surface-mount crystal unit according to the present embodiment, the opposite diagonal corners of crystal blank 2 to which extension electrodes 7 extend are electrically and mechanically connected to the bottom of the recess in casing body 1 by electrically conductive adhesive 8. If crystal blank 2 has a relatively large longitudinal dimension as shown in FIG. 3B, the opposite diagonal corners of crystal blank 2 are fixed to respective first connecting terminals 9. If crystal blank 2 has a relatively small longitudinal dimension as shown in FIG. 4, then the opposite diagonal corners of crystal blank 2 are fixed to respective second connecting terminals 10. If the relatively large crystal blank is fixed in place, then second connecting terminals 10 are positioned beneath the crystal blank. However, since first connecting terminals 9 are thicker than second connecting terminals 10, second connecting terminals 10 are prevented from being brought into contact with excitation electrodes, for example, of the crystal blank, and hence from impairing the vibration characteristics of the crystal blank.

In the crystal unit of the present embodiment, depending on the length of crystal blank 2, first connecting terminals 9 or second connecting terminals 10 are selected to hold crystal blank 2 in position. Therefore, casing body 1 can be shared by crystal blanks having different lengths. Consequently, since casing body 1 can be shared by crystal blanks having different vibration frequencies, required production management schemes are simple, an inventory of parts or components needed to manufacture the surface-mount crystal unit is reduced, and the cost of the surface-mount crystal unit is lowered.

What is claimed is:

1. A surface-mount casing comprising:

a casing body;

a pair of first connecting terminals disposed on respective paired diagonal corners of an inner bottom surface of said casing body; and a pair of second connecting terminals disposed on respective other paired diagonal corners of the inner bottom surface of said casing body;

said second connecting terminals extending more closely to a center of said inner bottom surface than said first connecting terminals, said first connecting terminals being thicker than said second connecting terminals.

2. The surface-mount casing according to claim 1, wherein said inner bottom surface has a substantially rectangular shape.

3. The surface-mount casing according to claim 2, wherein one of said first connecting terminals and one of said second connecting terminals are disposed along each of shorter sides of said inner bottom surface and electrically connected to each other.

4. The surface-mount casing according to claim 3, wherein one of said first connecting terminals and one of said second connecting terminals are disposed along each of shorter sides of said inner bottom surface and integrally formed with each other, said surface-mounting casing further comprising:

mounting electrodes disposed on an outer bottom surface of said casing body and each electrically connected to said one of the first connecting terminals and said one of the second connecting terminals which are electrically connected to each other.

5. A crystal unit comprising:

a casing body;

a pair of first connecting terminals disposed on respective paired diagonal corners of an inner bottom surface of said casing body;

a pair of second connecting terminals disposed on respective other paired diagonal corners of the inner bottom surface of said casing body; and a crystal blank having a pair of excitation electrodes and a pair of extension electrodes, said extension electrodes extending to outer peripheral portions of said crystal blank from said excitation electrodes, respectively;

said second connecting terminals extending more closely to a center of said inner bottom surface than said first connecting terminals, said first connecting terminals being thicker than said second connecting terminals, said extension electrodes being electrically and mechanically connected to either said first connecting electrodes or said second connecting electrodes depending on a size of said crystal blank.

6. The crystal unit according to claim 5, further comprising a cover hermetically sealing said crystal blank in said casing body.

7. The crystal unit according to claim 5, wherein said extension electrodes are fixed to either said first connecting electrodes or said second connecting electrodes by an electrically conductive adhesive.

8. The crystal unit according to claim 5, wherein said inner bottom surface has a substantially rectangular shape.

9. The crystal unit according to claim 8, wherein one of said first connecting terminals and one of said second connecting terminals are disposed along each of shorter sides of said inner bottom surface and integrally formed with, and electrically connected to, each other, said crystal unit further comprising:

mounting electrodes disposed on an outer bottom surface of said casing body and each electrically connected to said one of the first connecting terminals and said one of the second connecting terminals which are electrically connected to each other.

10. The crystal unit according to claim 9, wherein said crystal blank has a substantially rectangular planar shape, said extension electrodes extending respectively to opposite ends of a diagonal line of said crystal blank and being folded back a short distance over opposite principal surfaces of the crystal blank across diagonal corners thereof.

* * * * *